United States Patent
Tanaka

(10) Patent No.: US 7,489,550 B2
(45) Date of Patent: Feb. 10, 2009

(54) EEPROM AND METHOD OF DRIVING THE SAME

(75) Inventor: Kouji Tanaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 42 days.

(21) Appl. No.: 11/524,300

(22) Filed: Sep. 21, 2006

(65) Prior Publication Data

US 2007/0064488 A1 Mar. 22, 2007

(30) Foreign Application Priority Data

Sep. 22, 2005 (JP) .............................. 2005-275356

(51) Int. Cl.
*G11C 16/04* (2006.01)
(52) U.S. Cl. .............................. 365/185.18; 365/185.28; 365/185.29
(58) Field of Classification Search ............ 365/185.18, 365/185.28, 185.29, 185.22, 185.06; 257/314–315, 257/E21.69
See application file for complete search history.

(56) References Cited

U.S. PATENT DOCUMENTS

| 6,044,018 | A | 3/2000 | Sung et al. | |
| 6,614,684 | B1 * | 9/2003 | Shukuri et al. | 365/185.05 |
| 6,671,209 | B2 * | 12/2003 | Lin et al. | 365/185.29 |
| 6,901,006 | B1 * | 5/2005 | Kobayashi et al. | 365/185.01 |
| 6,954,381 | B2 * | 10/2005 | Guterman et al. | 365/185.28 |
| 7,289,362 | B2 * | 10/2007 | Solo de Zaldivar et al. | 365/185.05 |

FOREIGN PATENT DOCUMENTS

| JP | 06-334190 A | 12/1994 |
| JP | 2596695 B | 1/1997 |

* cited by examiner

*Primary Examiner*—David Lam
(74) *Attorney, Agent, or Firm*—Sughrue Mion, PLLC

(57) ABSTRACT

An EEPROM (Electrically Erasable and Programmable Read Only Memory) has a first MOS transistor and a second MOS transistor. The first MOS transistor and the second MOS transistor have a common gate electrode and constitute one memory cell. A program operation and an erase operation are carried out by using the first MOS transistor. A read operation is carried out by using the second MOS transistor.

4 Claims, 6 Drawing Sheets

DATA READ TRANSISTOR    CONTROL GATE WELL CAPACITOR

EEPROM AND METHOD OF DRIVING THE SAME

BACKGROUND OF THE INVENTION

1. Field of the Invention

The present invention relates to an EEPROM (Electrically Erasable and Programmable Read Only Memory) and a method of driving the same. In particular, the present invention relates to an EEPROM embedded in a liquid crystal driver IC and a method of driving the same.

2. Description of the Related Art

An EEPROM has been often used as an external part of an integrated circuit (IC). In recent years, there is growing demand to embed the EEPROM in an IC itself for the purpose of reducing the number of parts at the time of implementation and adjusting characteristics of a liquid crystal driver IC.

From the aspect of intended purpose, an EEPROM embedded in the liquid crystal driver IC is characterized by the following points: (1) the number of bits can be as small as several bits to several hundreds bits; (2) a few rewritable times are sufficient; (3) the reliability of data holding must be ensured over a long period of time; and (4) increase in the cost must be avoided. Against such a background, an EEPROM having a single-layer poly structure may be used as the embedded EEPROM. Although there is disadvantage in area, the EEPROM with a single-layer poly structure can be fabricated by adding a few processes to the existing CMOS process, which is advantageous in terms of cost.

For example, Japanese Patent Publication No. JP-2596695 discloses a conventional EEPROM having a single-layer poly structure as shown in FIG. 1. The EEPROM (one memory cell) shown in FIG. 1 has an Nch MOS transistor and a Pch MOS transistor. A gate poly 18 of the Nch MOS transistor and the Pch MOS transistor is common. The Nch MOS transistor consists of diffusion layers 12a, 12b and a gate electrode 13. The Pch MOS transistor consists of diffusion layers 15a, 15b, 16 and a gate electrode 17. An N-type well 14 is formed in a P-type semiconductor substrate 20. Terminals 10, 11 and 19 are used for applying voltages to the diffusion layers. Respective of the two MOS transistors are used as a data read transistor and a control gate well capacitor. A gate capacitance of the control gate well capacitor is designed to be smaller than a gate capacitance of the data read transistor. In FIG. 1, the Nch MOS transistor is formed as the data read transistor, while the Pch MOS transistor is formed as the control gate well capacitor.

Operation conditions of the above-described conventional EEPROM are as follows. At the time of data programming, the data is programmed through an FN tunnel current method or a hot carrier injection method in the side of the Nch MOS transistor. At the time of data erasing, the data is erased through the FN tunnel current method in the side of the Nch MOS transistor or the Pch MOS transistor. A data reading is carried out in the side of the Nch MOS transistor. At the time of the data reading, a voltage +Vr is applied to the Pch MOS transistor such that a gate voltage of the memory cell is increased and thereby the data is sensed.

SUMMARY OF THE INVENTION

The present invention has recognized the following points. In the EEPROM according to the conventional technique, the two MOS transistors are used. Due to the configuration, one of the two MOS transistors functions as a transistor (for use in data reading), while the other functions as a capacitor (for use as a control gate). With respect to characteristics of the cell at the time of the data reading, the characteristics of the data read transistor are dominant. Thus, the data read transistor is important from the viewpoint of the characteristics of the cell.

According to the conventional technique, however, the data read transistor is used also in the data programming and erasing. As a result, the hot carrier injection and the FN tunnel current give severe stress to a gate oxide film of the data read transistor, which has an adverse affect on the data holding reliability of the EEPROM cell.

If the data erasing is carried out in the side of the control gate well capacitor for the purpose of suppressing the above-mentioned adverse affect, the stress is imposed on its gate oxide film. Such a method is effective in view of the importance of the characteristics of the EEPROM cell. However, according to the conventional technique, the voltage +Vr is applied to the control gate well capacitor at the time of the data reading. In this case, an electric field is applied to the gate oxide film every time the data is read, which also has an adverse affect on the data holding reliability of the EEPROM cell.

According to the present invention, the data program operation and the data erase operation are carried out without using a data read transistor. As a result, the data holding reliability of the EEPROM cell is improved. Further, an electric field is not applied to the gate oxide film of the control gate well capacitor in the data reading operation. As a result, the data holding reliability of the EEPROM cell is improved.

According to the present invention, as described above, the data programming and the data erasing are carried out in the side of a transistor functioning as a capacitor, where the data read transistor is not used at all. As a result, the stress is not imposed on the gate oxide film of the data read transistor. Therefore, the data holding reliability of the EEPROM can be improved according to the present invention.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 2:
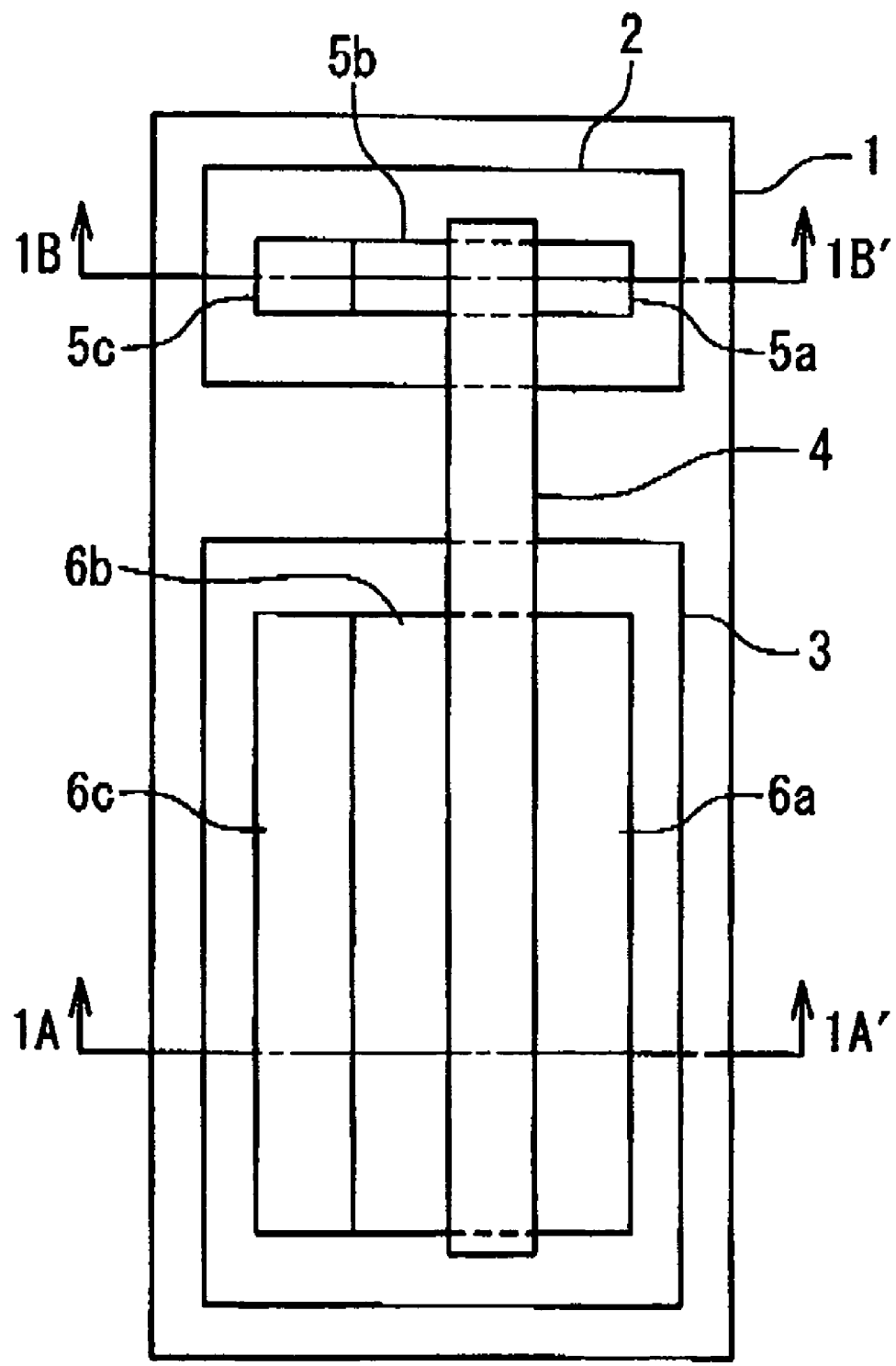
FIG. 2 is a plan view illustrating a configuration of an EEPROM according to an embodiment of the present invention.
Figure 3:
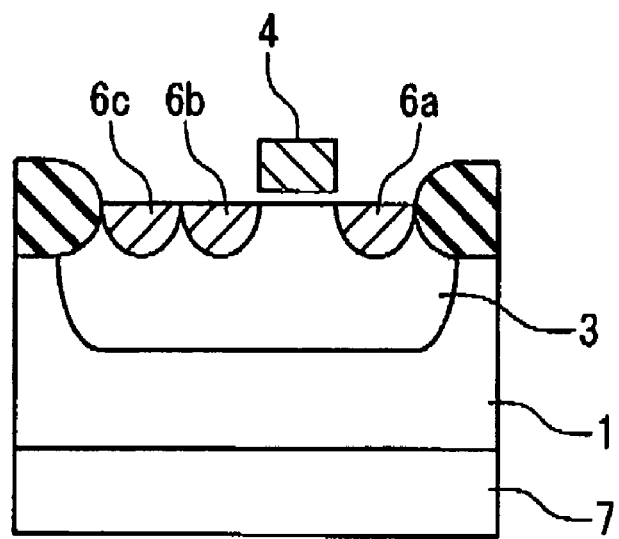
FIG. 3 is a cross sectional view illustrating a structure of an Nch MOS transistor section of the EEPROM according to the embodiment of the present invention.
Figure 4:
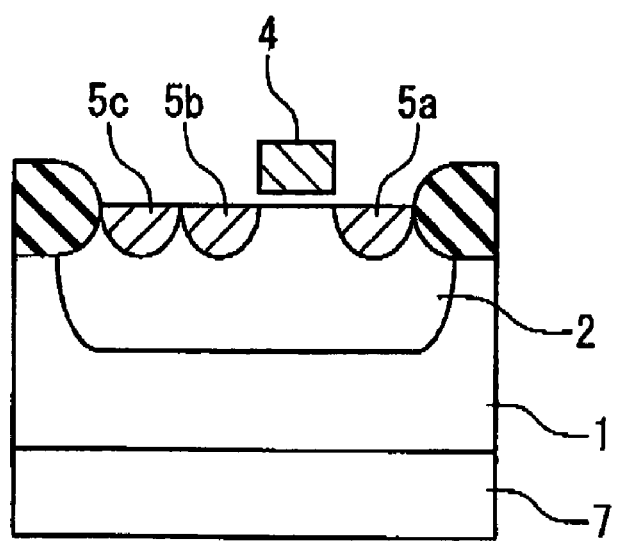
FIG. 4 is a cross sectional view illustrating a structure of a Pch MOS transistor section of the EEPROM according to the embodiment of the present invention.

FIG. 2 is a plan view illustrating a configuration of an EEPROM according to an embodiment of the present invention. In FIG. 2, one memory cell (one EEPROM cell) is shown. FIG. 3 is a cross sectional view along a line 1A-1A' in FIG. 2 and shows a structure of a data read transistor. FIG. 4 is a cross sectional view along a line 1B-1B' in FIG. 2 and shows a structure of a control gate well capacitor.

An N-type well 1 is formed in a P-type semiconductor substrate 7. The N-type well 1 is for isolating a device from a potential of the P-type semiconductor substrate 7. An N-type well 2 and a P-type well 3 is formed on the N-type well 1. The EEPROM cell according to the present embodiment has a first MOS transistor serving as the control gate well capacitor and a second MOS transistor serving as the data read transistor. The first MOS transistor (Pch MOS transistor) as the control gate well capacitor is formed on the N-type well 2 and has a gate electrode 4 and diffusion layers 5a to 5c. The diffusion layers 5a to 5c include a P+ diffusion layer 5a for use as a drain, a P+ diffusion layer 5b for use as a source, and an N+ diffusion layer 5c for use as a back gate. The second MOS transistor (Nch MOS transistor) as the data read transistor is formed on the P-type well 3 and has a gate electrode 4 and diffusion layers 6a to 6c. The diffusion layers 6a to 6c include an N+ diffusion layer 6a for use as a drain, an N+ diffusion layer 6b for use as a source, and a P+ diffusion layer 6c for use as a back gate. The gate electrode 4 is made of poly-silicon and shared by the first MOS transistor and the second MOS transistor. That is, the first MOS transistor and the second MOS transistor have a common gate electrode (gate polysilicon) 4. The gate electrode 4 serves as a floating gate of the EEPROM cell. A gate oxide film as a gate insulating film (not shown) is formed between the gate electrode 4 and the p-type semiconductor substrate 7.

Next, operations of the EEPROM according to the present embodiment will be described below.

(Data Erase Operation)

Figure 5:
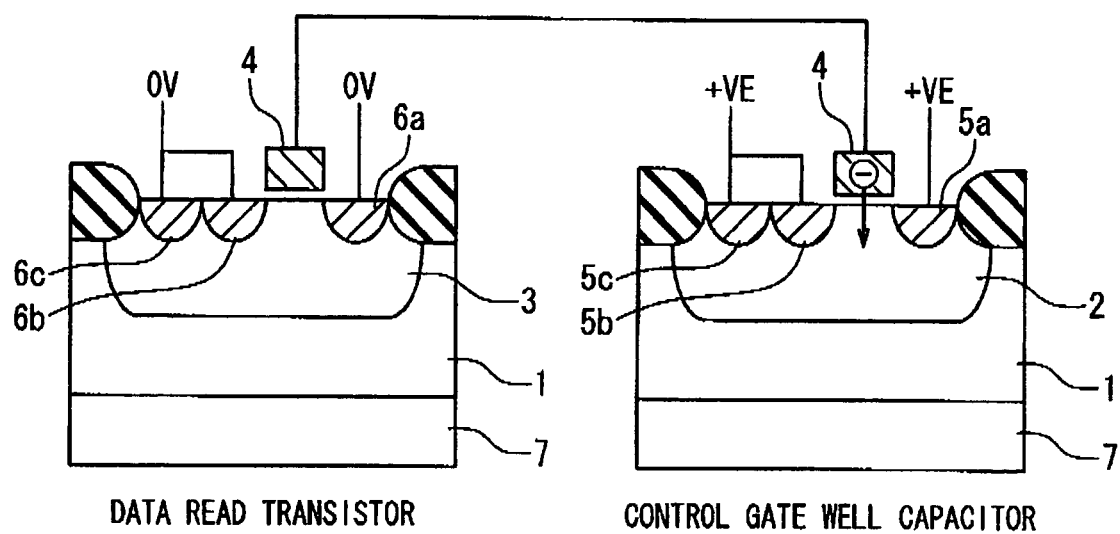
FIG. 5 is a view showing a voltage application condition at the time of a data erase operation in the EEPROM according to the embodiment of the present invention.

FIG. 5 schematically shows a voltage application condition at the time of the data erase operation. A voltage of 0 [V] is applied to all of the diffusion layers 6a to 6c of the data read transistor. A voltage of +VE [V] is applied to all of the diffusion layers 5a to 5c of the control gate well capacitor. Due to the application of such voltages, an FN tunnel current flows through the gate oxide film of the control gate well capacitor. As a result, electrons are drawn out of the floating gate (gate polysilicon 4) through the gate oxide film of the control gate well capacitor. It should be noted here that only the control gate well capacitor is used and the data read transistor is not used at all in the data erase operation.

(Data Program Operation)

Figure 6:
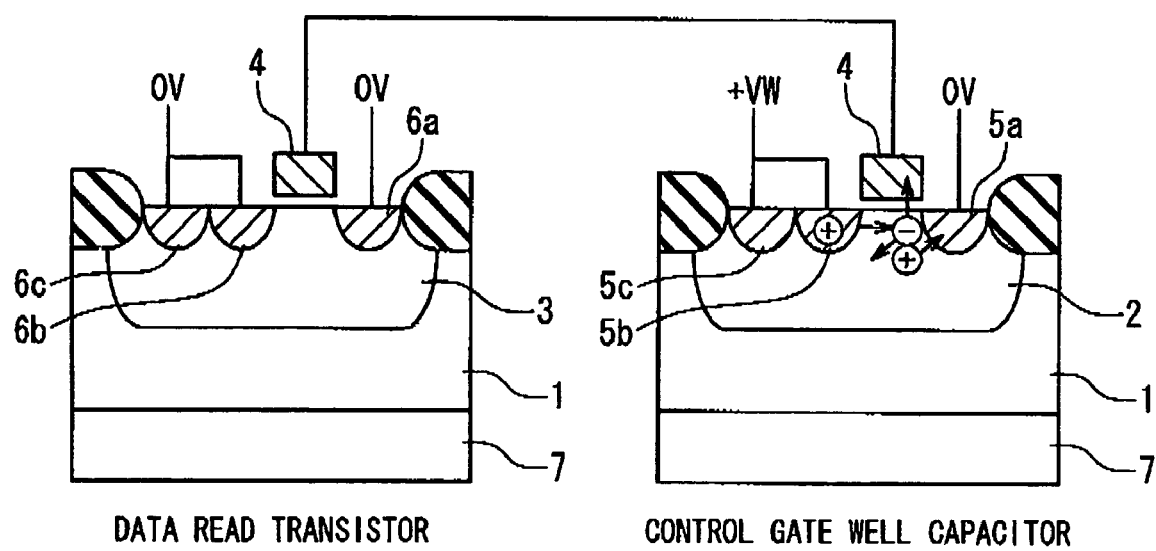
FIG. 6 is a view showing a voltage application condition at the time of a data program operation in the EEPROM according to the embodiment of the present invention.
Figure 7:
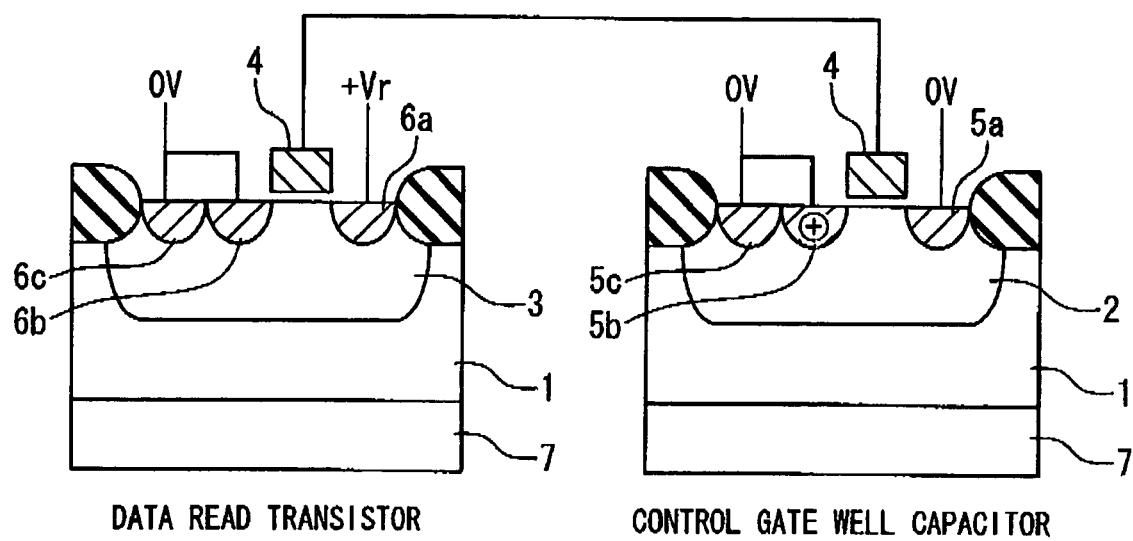
FIG. 7 is a view showing a voltage application condition at the time of a data read operation in the EEPROM according to the embodiment of the present invention.

FIG. 6 schematically shows a voltage application condition at the time of the data program operation. A voltage of 0 [V] is applied to all of the diffusion layers 6a to 6c of the data read transistor. A voltage of 0 [V] is applied to the diffusion layer 5a, and a voltage of +VW [V] is applied to the diffusion layers 5b and 5c of the control gate well capacitor. Due to the application of such voltages, the Pch MOS transistor as the control gate well capacitor is turned ON and hence a current flows between the diffusion layer 5a and the diffusion layer 5b. As a result, channel hot electrons are generated and injected into the floating gate (gate polysilicon 4) through the gate oxide film of the control gate well capacitor. It should be noted here that only the control gate well capacitor is used and the data read transistor is not used at all in the data program operation.

(Data Read Operation)

Figure 1:
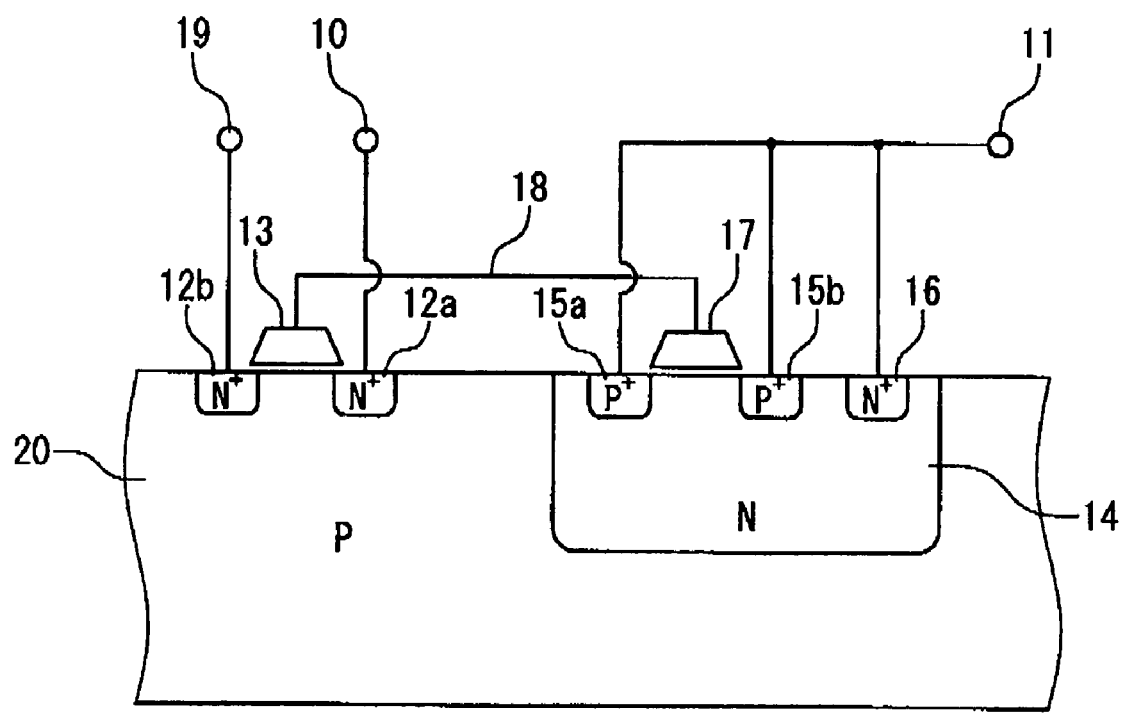
FIG. 1 is a schematic diagram showing a configuration of an EEPROM cell according to the conventional technique.

FIG. 1 schematically shows a voltage application condition at the time of the data read operation. A voltage of +Vr [V] is applied to the diffusion layer 6a, and a voltage of 0 [V] is applied to the diffusion layers 6b and 6c of the data read transistor. A voltage of 0 [V] is applied to all of the diffusion layers 5a to 5c of the control gate well capacitor. The data stored in the EEPROM cell is determined in accordance with whether the data read transistor is turned ON or not under the above condition. In the case when the data is programmed, the data read transistor is turned OFF since electrons excessively exist in the floating gate. In the case when the data is erased, the data read transistor is turned ON since electrons are insufficient in the floating gate. It should be noted here that only the data read transistor is used and the control gate well capacitor is not used in the data read operation.

According to the EEPROM of the present invention, as described above, the MOS transistor in which the charge transfer is carried out at the time of the data programming and the data erasing is definitely separated from the MOS transistor that is operated at the time of the data reading. It is thus possible to minimize deterioration of the gate oxide film of the data read transistor. Therefore, the data holding reliability of the EEPROM cell is improved. Furthermore, the potential of the diffusion layers 5a to 5c of the control gate well capacitor is fixed to 0 [V] at the time of the data read operation. Consequently, an electric field is not applied to the gate oxide film of the control gate well capacitor at the time of the data read operation. This also improves the data holding reliability of the EEPROM cell.

It is apparent that the present invention is not limited to the above embodiment and may be modified and changed without departing from the scope and spirit of the invention.

What is claimed is:

1. An EEPROM comprising:
    a P-channel MOS transistor; and
    an N-channel MOS transistor,
    wherein said P-channel MOS transistor and said N-channel MOS transistor have a common floating gate electrode and constitute one memory cell,
    wherein a read operation is carried out by using said N-channel MOS transistor, and
    wherein charges are injected into and drawn out of said common floating gate electrode through a gate insulating film of said P-channel MOS transistor, where a voltage of 0 V is applied to a source, drain and a back gate of said N-channel MOS transistor.

2. The EEPROM according to claim 1, wherein in said read operation, a voltage of 0 V is applied to a source, drain and a back gate of said P-channel MOS transistor.

3. A method of driving an EEPROM, said EEPROM comprising a P-channel MOS transistor and an N-channel MOS transistor which have a common floating gate electrode and constitute one memory cell, said method comprising:
   carrying out a read operation by using said N-channel MOS transistor;
   carrying out a program operation by injecting charges into said common floating gate electrode through a gate insulating film of said P-channel MOS; and
   carrying out an erase operation by drawing charges out of said common floating gate electrode through said gate insulating film of said P-channel MOS transistor,
   wherein in said program operation and said erase operation, a voltage of 0 V is applied to a source, drain and a back gate of said N-channel MOS transistor.

4. The method according to claim 3, wherein in said read operation, a voltage of 0 V is applied to a source, drain and a back gate of said P-channel MOS transistor.

* * * * *